United States Patent [19]

Ting et al.

[11] Patent Number: 5,604,037

[45] Date of Patent: Feb. 18, 1997

[54] DIAMOND/CARBON/CARBON COMPOSITE USEFUL AS AN INTEGRAL DIELECTRIC HEAT SINK

[75] Inventors: Jyh-Ming Ting, Fairborn; Max L. Lake, Yellow Springs, both of Ohio

[73] Assignee: Applied Sciences, Inc., Cedarville, Ohio

[21] Appl. No.: 332,903

[22] Filed: Nov. 1, 1994

Related U.S. Application Data

[62] Division of Ser. No. 044,223, Apr. 7, 1993, Pat. No. 5,389,400.

[51] Int. Cl.$^6$ .................................................. C23C 16/26
[52] U.S. Cl. .......................... 428/408; 428/457; 428/367; 428/368
[58] Field of Search .................................. 428/408, 457, 428/367, 368

[56] References Cited

U.S. PATENT DOCUMENTS

| | | |
|---|---|---|
| 3,949,062 | 4/1976 | Vereschagin et al. . |
| 4,122,636 | 10/1978 | Roy et al. . |
| 4,396,663 | 8/1983 | Mitchell et al. . |
| 4,437,962 | 3/1984 | Banks . |
| 4,490,201 | 12/1984 | Leeds . |
| 4,504,519 | 3/1985 | Zelez . |
| 4,830,702 | 5/1989 | Singh et al. . |
| 4,859,493 | 8/1989 | Lemelson . |
| 4,938,940 | 7/1990 | Hirose et al. . |
| 4,940,015 | 7/1990 | Kobashi et al. . |
| 4,944,904 | 7/1990 | Singh et al. . |
| 4,958,590 | 9/1990 | Goforth . |
| 4,961,958 | 10/1990 | Desphandey et al. . |
| 5,008,737 | 4/1991 | Burnham et al. . |
| 5,096,352 | 3/1992 | Lemelson ................................ 411/424 |
| 5,126,206 | 6/1992 | Garg et al. . |
| 5,203,924 | 4/1993 | Mitani et al. . |
| 5,204,167 | 4/1993 | Saijo et al. . |

FOREIGN PATENT DOCUMENTS

| | | |
|---|---|---|
| 60-113985 | 6/1985 | Japan . |
| 63-008284 | 1/1988 | Japan . |
| 01009882 | 1/1989 | Japan . |
| 4170381 | 6/1992 | Japan . |

OTHER PUBLICATIONS

J. M. Ting and M. L. Lake, "Diamond–infiltrated carbon–carbon composites", *Diamond and Related Materials*, 2 (1993) pp. 1069–1077.

R. Messier, "The Quest for Diamond Coatings," *J. of Metals*, Sep. 1987, pp. 8–11.

W. Zhu et al, "Graphite Formation in CVD Diamond Film Deposition," 35th Nat. Symposium of American Vacuum Society, Atlanta, Ga., Oct. 1988, pp. 1–22.

R. Messier et al., "From Diamond–like Carbon to Diamond Coating," presented at ICMC, San Diego, 1987, pp. 1–11.

A. R. Badzian et al, "Crystallization of Diamond Crystals and Films by Microwave Assisted CVD (Part II) Materials Research Bulletin", vol. 23, pp. 531–548, 1988.

(List continued on next page.)

*Primary Examiner*—Archene Turner
*Attorney, Agent, or Firm*—Killworth, Gottman, Hagan & Schaeff

[57] ABSTRACT

A diamond/carbon/carbon composite is provided comprising a carbon/carbon composite having a polycrystalline diamond film deposited thereon. The carbon/carbon composite comprises a preform of interwoven carbon fibers comprising vapor grown carbon fibers. The preferred method of producing the composite involves chemical vapor infiltration of the pyrolytic carbon into the interstices of the preform, followed by microwave plasma enhanced chemical vapor deposition of the diamond film on the carbon/carbon composite. The resulting diamond/carbon/carbon composite is useful as an integral dielectric heat sink for electronic systems in spacecraft, aircraft and supercomputers due to its thermal management properties. Such a heat sink can be made by depositing metallic circuits on the diamond layer of the diamond/carbon/carbon composite.

5 Claims, 1 Drawing Sheet

OTHER PUBLICATIONS

A. Badzian et al, "Vapor Deposition Synthesis of Diamond Films," *SPIE* vol. 683, Infrared and Optical Transmitting Materials, Aug. 1986, pp. 127–138.

B. V. Deryagin et al., "Epitaxial Synthesis of Diamond in the Metastable Region," Russian Chemical Reviews, 39 (9), 1970, pp. 783–788.

R. C. DeVries, "Synthesis of Diamond under Metastable Conditions," Annual Rev. Assisted CVD Material Sci., 1987, 17:161–187.

Geis et al, "Diamond Film Semiconductors," *Sci. American*, Oct. 1992, pp. 84–89.

Chang et al, "Diamond Crystal Growth by Plasma Chemical Vapor Deposition," *J. Appl. Phys.*, 63 (5), Mar. 1988.

A. R. Badzian et al, "Diamond Thin films Prepared by Plasma Chemical Vapor Deposition Processes," Mat. Research Soc. Meeting, Jun. 1987, vol. 15, pp. 63–77, Les Addition de Physique, Paris.

5,604,037

DIAMOND/CARBON/CARBON COMPOSITE USEFUL AS AN INTEGRAL DIELECTRIC HEAT SINK

GOVERNMENT RIGHTS

This invention was made with Government support under Contract No. F33615-92-C-2240 awarded by the U.S. Air Force Systems Command. The Government has certain rights in the invention.

CROSS-REFERENCE TO RELATED APPLICATION

This is a divisional of application Ser. No. 08/044,223, filed Apr. 7, 1993, now U.S. Pat. No. 5,389,400.

BACKGROUND OF THE INVENTION

The present invention relates to a unique diamond/carbon/carbon composite useful as an integral dielectric heat sink, and a method for making such a composite. More particularly, the present invention relates to a diamond/carbon/carbon composite formed by depositing polycrystalline diamond on a carbon/carbon composite, and to an integral dielectric heat sink formed by depositing a metallic film on the diamond layer of the resulting diamond/carbon/carbon composite.

In recent years, demand has increased for high power, high density electronic devices used for advanced systems such as aircraft, spacecraft, and supercomputers. One known solution to this problem entails fabricating multichip module (MCM) circuitry with greater circuit density and more efficient electrical performance. However, while this process provides superior electrical performance, the increased circuit density raises the power density within the MCM, increasing the heat dissipation requirements. Ongoing improvements to heat sink materials must be made to avoid heat-induced failure of such electronic devices.

Semiconductor bases have been produced using composites comprising fibers, fiber bundles, and woven fiber bundles of graphite, boron, tungsten and glass. However, such composites do not have a very high thermal conductivity.

Carbon fiber reinforcements have made significant improvements in properties of composites of various polymeric, metal, and ceramic matrices. However, a limiting factor in the use of such fibers is their highly anisotropic thermal conductivity and their inability to match the coefficient of thermal expansion of the circuit material, which is typically silicon or gallium arsenide.

Various processes have been developed in recent years to produce synthetic diamonds for use as heat sinks in the electronics field. Although diamond is electrically insulating, diamond has the highest thermal conductivity found in nature. Thus, diamond is an ideal heat sink material for semiconductor devices. Diamond has other desirable properties including high hardness, high dielectric strength and breakdown fields, chemical stability, and a coefficient of thermal expansion (CTE) which is suitable for matching a wide range of CTE's of materials to which the composite is mated.

One process for synthesizing diamond is to use microwave assisted chemical vapor deposition to deposit diamond on silicon substrates. Such a process is described in Badzian et al, "Vapor Deposition Synthesis of Diamond Films", Proceedings of SPIE, Vol. 683, 1986. Another process involves growing diamond crystals by plasma chemical vapor deposition as described in Chang et al, "Diamond Crystal Growth by Plasma Chemical Vapor Deposition", *J. Appl. Phys.* 63(5), 1988.

Still other processes have been developed for production of layers of polycrystalline diamond on a substrate with recovery of flakes for use in composites. One such process is described in Banks, U.S. Pat. No. 4,437,962. A composite is produced by depositing carbon on a surface, creating diamond bonds in the carbon, removing flakes of the carbon, and mixing the flakes with a matrix material to form the composite material. However, the production of such flakes requires a relatively complex process.

Accordingly, there is still a need in the art for an improved composite having superior electrical and thermal performance, low density and high mechanical strength. Further, there is a need for an improved composite which may be used as a high thermal conductivity dielectric heat sink.

SUMMARY OF THE INVENTION

The present invention meets that need by providing a unique diamond/carbon/carbon composite having a polycrystalline diamond film deposited on a carbon/carbon composite which exhibits superior electrical and thermal performance, low density, and high mechanical strength. The present invention further provides an innovative integral dielectric substrate or heat sink material useful as a semiconductor base.

In accordance with one embodiment of the invention, a diamond/carbon/carbon composite is provided comprising a carbon/carbon composite and a polycrystalline diamond film deposited on the carbon/carbon composite. In a preferred embodiment of the invention, the carbon/carbon composite comprises a preform of interwoven carbon fibers having pyrolytic carbon deposited into interstices of the preform.

The carbon fibers preferred for use in the present invention are graphitic fibers. Preferably, the graphitic fibers are vapor grown carbon fibers, which have a very high thermal conductivity. Such fibers have also been called benzene derived fibers and catalytic chemical vapor deposition fibers. However, for purposes of the present invention, the fibers will be referred to as vapor grown carbon fibers. Vapor grown carbon fibers have a tensile strength as high as 7 GPa, as well as a tensile modulus of 600 Gpa. In addition, the room-temperature thermal conductivity of vapor grown carbon fibers is in the range of 2000 W/m-K.

A method of making the diamond/carbon/carbon composite is also provided which generally comprises the steps of densifying a preform of interwoven carbon fibers by depositing pyrolytic carbon into the interstices of the preform to produce a carbon/carbon composite. A polycrystalline diamond film is then deposited on the carbon/carbon composite.

Preferably, the preform is densified by a chemical vapor infiltration process which uses a mixture of hydrogen and hydrocarbon gases. The hydrocarbon gas preferably comprises at least 50% but not more than 75% by volume of the mixture. The chemical vapor infiltration process is preferably carried out at a temperature of from about 1000° C. to about 1100° C., and at a pressure of from about 5 torr to about 40 torr.

In an alternative embodiment of the invention, the preform is densified by a pitch infiltration process in which molten pitch from coal tar or petroleum sources is impregnated into the fiber preform under heat and pressure. This process is followed by pyrolysis and subsequent re-impregnations until the pores between the fibers are filled to the point of sealing, all as is known in the art. See, for example, U.S. Pat. Nos. 4,490,201 and 4,396,663, the disclosures of which are hereby incorporated by reference.

The polycrystalline diamond film is preferably deposited on the resulting carbon/carbon composite by a microwave plasma enhanced chemical vapor deposition process using a mixture of hydrogen and hydrocarbon gases. The preferred hydrocarbon gas is methane, which preferably comprises at least 0.1% but not more than 2% by volume of the mixture. The process is preferably carried out at a temperature range of from about 850° C. to about 1100° C., and a pressure of from about 15 torr to 50 torr. When deposited on the surface of the carbon/carbon composite, the diamond becomes partially infiltrated into the carbon/carbon composites. By infiltrated, we mean that the pyrolyzed carbon near the surface of the carbon/carbon composite is partially replaced by polycrystalline diamond.

In an alternative embodiment, the diamond film may be deposited by a hot filament technique. This process is preferably carried out at a temperature range of from about 850° C. to about 1100° C., and a pressure of from about 15 torr to 50 torr.

The resulting diamond/carbon/carbon composite may be used as a high performance integral dielectric heat sink or substrate material having high thermal conductivity, and low electrical conductivity. In addition, the diamond carbon/carbon composite has a coefficient of thermal expansion which may be tailored to improve reliability and high thermal energy management of electronic devices including electronics for space and aerospace vehicles. For example, in one embodiment of the invention, the diamond/carbon/carbon composite may be further formed into an integral dielectric heat sink by depositing a metallic film on the diamond layer of the diamond/carbon/carbon composite.

Accordingly, it is an object of the present invention to provide a diamond carbon/carbon composite having high thermal conductivity, electrical insulation, and low density. It is also an object of the present invention to provide a diamond carbon/carbon composite which is useful as an integral dielectric heat sink. This, and other objects and advantages of the invention will become apparent from the following detailed description, the accompanying drawings, and the appended claims.

DETAILED DESCRIPTION OF THE PREFERRED EMBODIMENT

The diamond/carbon/carbon composite of the present invention is capable of advancing the performance capacity of power electronics. The carbon/carbon composite has a higher thermal conductivity and lower density than other materials such as metals and ceramic materials conventionally used in electronic packaging. The carbon/carbon composite is also an electrical conductor, which typically requires an electrical-insulating surface layer for such electronic packaging applications. However, we have found that by depositing a diamond film on the high thermal conductivity carbon/carbon composite of the present invention, electrical insulation is achieved without the need for conventional electrically insulating coatings. The application of the diamond film on the carbon/carbon composite also facilitates electrical circuit printing directly on the diamond/carbon/carbon composite. Further, because the diamond coating partially infiltrates the surface of the carbon/carbon composite, the coefficient of thermal expansion of the resulting diamond/carbon/carbon composite may be tailored for specific applications.

Figure 1:
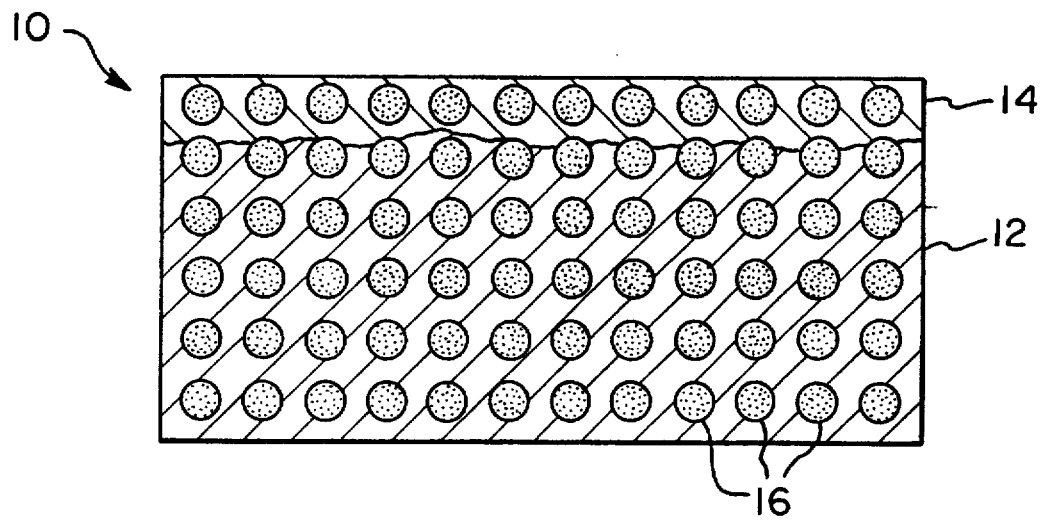
FIG. 1 is a cross-sectional view of the diamond/carbon/carbon composite of the present invention.

The diamond/carbon/carbon composite 10 of the present invention is illustrated in FIG. 1. The diamond/carbon/carbon composite comprises a carbon/carbon composite 12 comprised of a preform of interwoven carbon fibers 16. A polycrystalline diamond film 14 is deposited on the carbon/carbon composite. As shown in the drawings, the diamond coating partially infiltrates the surface of the carbon/carbon composite to a certain depth which for representation purposes is shown as being slightly more than one row of carbon fibers deep.

The carbon fibers 16 preferably comprise graphitic fibers which are vapor grown carbon fibers. Vapor grown carbon fibers are preferred as they have a tensile strength as high as 7 GPa, as well as a high tensile modulus of greater than 480 GPa. The vapor grown carbon fibers have a room-temperature thermal conductivity in the range of about 2000 W/m-K, which is several times that of copper and aluminum, and essentially equals that of single crystal graphite. Such fibers have a graphitic nature which resembles an "onion-ring" structure of graphene planes within the fibers.

Densification of the vapor grown carbon fiber preform with pyrolytic carbon prior to diamond deposition may be accomplished by conventional methods including chemical vapor infiltration and pitch infiltration. Preferred is a chemical vapor infiltration process which involves the pyrolysis of a hydrocarbon gas and deposition of pyrolytic carbon into the preform. The formation of pyrolytic carbon is characterized by development of basal graphitic planes in the same method orientation as the carbon fibers. A gaseous mixture of a hydrocarbon gas and hydrogen is used for this purpose. A preferred hydrocarbon gas is methane, which preferably comprises at least 50% but not more than 75% by volume of the mixture.

The chemical vapor infiltration process should be carried out at a temperature of from about 1000° C. to about 1100° C., and the pressure should be maintained at a range of from about 5 torr to about 40 torr. However, it should be noted that the extent of densification may be controlled by varying the concentration of the hydrocarbon gas along with pressure, temperature, and time parameters. The pyrolytic carbon in the resulting carbon/carbon composite is highly aligned and closely resembles single crystal graphite.

An alternative method of densification is pitch infiltration. In this process, molten pitch from coal tar or petroleum processes is impregnated into the fiber structure, followed by pyrolysis and subsequent re-impregnations until the pores between the fibers are filled to the point of sealing as disclosed in U.S. Pat. Nos. 4,490,201 and 4,396,663. This process results in an aligned, graphitic microstructure.

The deposition of the polycrystalline diamond 14 onto the carbon/carbon composite 12 is preferably accomplished by a microwave plasma enhanced chemical vapor deposition using a mixture of hydrogen and hydrocarbon gases. The preferred hydrocarbon gas is methane, which preferably comprises at least 0.1% but not more than 2% by volume of the mixture. In order to achieve uniformity of the diamond coating, the process is preferably carried out at a temperature range of from about 850° C. to about 1100° C. and at a pressure of from about 15 torr to 50 torr.

Alternatively, the polycrystalline diamond may be deposited by a hot filament technique, which is preferably carried out at a temperature range of from about 850° C. to about 1100° C. and at a pressure of from about 15 torr to 50 torr.

Figure 2:
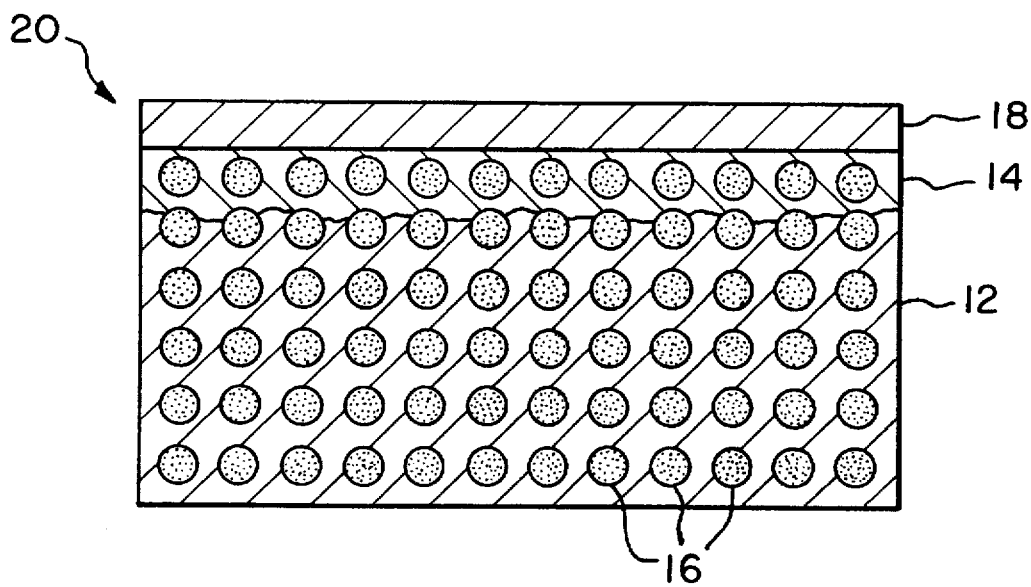
FIG. 2 is a cross-sectional view of an integral dielectric heat sink having the diamond/carbon/carbon composite as its base.

The resulting diamond/carbon/carbon composite is especially suited for use as an integral dielectric heat sink. As shown in FIG. 2, a metallic layer 18 of the desired circuit pattern is deposited on the diamond layer 14 of the diamond/carbon/carbon composite. Metallization of the diamond/carbon/carbon composite may be achieved by sputter depositing a layer of titanium or molybdenum in a range from about 200 angstroms to about 500 angstroms on the diamond/carbon/carbon composite. This step is followed by high temperature annealing to create a good chemical bond between the diamond and the metal layer. Next, a layer of copper, gold, platinum or gold/nickel is deposited onto the metal layer on the diamond/carbon/carbon substrate by electro-plating to achieve the film thickness that is required for proper current carrying capabilities. The resulting product is a diamond/carbon/carbon composite 20 upon which semiconductors can be mounted using conventional surface-mount technology.

Alternatively, metallization may involve spreading photoresist, a light sensitive emulsion, uniformly across the prepared composite. A mask with a desired trace pattern is then placed over the photoresist and exposed to light. The composite is then rinsed with a developing solution that washes away the exposed photoresist. A metallic layer is then deposited onto the composite. Finally, the unexposed layer of photoresist is dissolved and washed away by a solvent solution.

Another method of making a dielectric heat sink material is to lay a metallic layer on the diamond/carbon/carbon composite, followed by the application of the photoresist on top of the metallic layer. A mask for the traces is then applied on top of the photoresist. The exposed photoresist is then washed away, followed by the etching away of the unwanted portion of the metallic layer using an acidic solution.

The diamond/carbon/carbon composite has considerable potential in future electronic devices. The diamond film allows electric circuit printing to be successfully applied directly upon the composite material. Additionally, the diamond film provides electrical insulation from the composite material, and a high thermal conductivity medium into the composite material, thus preventing heat-induced failures in electronic devices. Thermal conductivity perpendicular to the z plane of the heat sink is maximized by the use of the diamond film while high thermal conductivity in the plane of the heat sink is obtained due to the properties of the carbon/carbon composite.

The following example is for purposes of illustrating the present invention. The example is not to be considered as limiting the scope of the claims appended hereto.

EXAMPLE 1

A diamond/carbon/carbon composite in accordance with the present invention was prepared. First, vapor grown carbon fibers were produced by the pyrolysis of a hydrocarbon gas in the presence of a catalyst in a two-stage process. Small particles of iron, with diameters less than 10 nm, were spread on a substrate as a catalyst for fiber growth. The substrate was then positioned in a furnace in which the temperature was subsequently ramped from room temperature to 900° C. At this temperature, a mixture of methane and hydrogen was introduced to initiate the fiber nucleation and growth. The filament diameter was then enlarged during a second stage by chemical vapor deposition of carbon using increased methane concentration. Vapor grown carbon fiber preforms were then fabricated by lay-up of vapor grown carbon fibers which were cut to the dimensions of a mold, formed into prepregs, and then cured in a hot-press. The preforms were slowly carbonized at 900° C. over a three day period. Following the carbonization, the preforms were graphitized at 2800° C. prior to densification.

Densification of the vapor grown carbon fiber preforms was achieved using a chemical vapor infiltration technique at a temperature between 1020° C. to 1080° C. and a pressure of 15 torr. The gaseous mixture used comprised 75% methane and 25% hydrogen. The composites were then heat treated at 2800° C. in argon for 15 minutes to graphitize the carbon.

The resulting carbon/carbon composites were then deposited with diamond using a microwave enhanced plasma chemical vapor deposition technique. Raman analysis of the composites was performed, and the Raman spectra of deposited diamond indicated high quality diamond formation at the surface of the carbon/carbon composite. Electrical conductivity measurements were also carried out on a specimen deposited with diamond. The conductivity was shown to be substantially higher than natural diamond, but still sufficiently low to be suitable as a dielectric layer.

EXAMPLE 2

Two samples of carbon/carbon composites were fabricated in accordance with the present invention. The specifications of the samples are shown below in Table I.

TABLE I

| Sample | FV (%) | Density (g/cc) | Conductivity (mK) | Specific Conductivity (W/mk/g/cc) | CTE (ppm/K) |
|---|---|---|---|---|---|
| 1 | 28 | 1.27 | X: 364 | 287 | 0.12 |
| 2 | 28 | 1.52 | X: 372 Z: 15 | 245 | 0.41 |

Diamond was deposited on the carbon/carbon composite samples using a microwave system at gaseous mixtures of 99.9% $H_2$/0.01% $CH_4$ and 99.5% $H_2$/0.5% $CH_4$. Following deposition, it was observed that the pyrolytic carbon on the surface of the carbon/carbon composite was etched away and partially replaced by polycrystalline diamond. Raman analysis was carried out on the sample containing 0.5% $CH_4$, and the resulting spectrum showed a diamond peak at 1333.1 $cm^{-1}$ and a graphite peak at 1439.2 $cm^{-1}$.

Deposition of diamond on Samples 1 and 2 was also carried out using the hot filament technique. Samples were deposited with diamond for 9 and 33 hours, respectively. Raman analysis of the two samples was then performed. The Raman spectrum for the 9-hour sample showed a diamond peak at 1331.9 $cm^{-1}$ and a broad background spectral feature indicating a small contribution from the graphite in the Raman spectrum of the sample. The sample exposed for 33 hours showed that the middle region of the sample received thicker deposition. The Raman spectrum for this sample demonstrated a single peak of diamond located at 1332.2 $cm^{-1}$. No contribution to the Raman spectrum from graphite was observed.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A diamond/carbon/carbon composite comprising:

a carbon/carbon composite comprising a preform of interwoven vapor grown carbon fibers having interstices therein and having pyrolytic carbon deposited into interstices of said preform; and a polycrystalline diamond coating directly on said carbon/carbon composite forming a polycrystalline diamond film, whereby said polycrystalline diamond coating partially infiltrates the surface of said carbon/carbon composite.

2. The composite of claim 1 further including a metallic layer deposited on the diamond layer of said diamond/carbon/carbon composite.

3. The composite of claim 1 wherein said vapor grown carbon fibers have a room-temperature thermal conductivity of about 2000 W/m-k.

4. The composite of claim 2 further including a layer selected from the group consisting of copper, gold, platinum and gold/nickel deposited on said metallic layer.

5. The composite of claim 2 wherein said metallic layer is selected from the group consisting of titanium and molybdenum.

* * * * *